United States Patent
Vasudevan

(10) Patent No.: US 8,120,430 B1
(45) Date of Patent: Feb. 21, 2012

(54) STABLE VCO OPERATION IN ABSENCE OF CLOCK SIGNAL

(75) Inventor: Narasimhan Vasudevan, Los Angeles, CA (US)

(73) Assignee: Xilinx, Inc., San Jose, CA (US)

( * ) Notice: Subject to any disclaimer, the term of this patent is extended or adjusted under 35 U.S.C. 154(b) by 185 days.

(21) Appl. No.: 12/354,614

(22) Filed: Jan. 15, 2009

(51) Int. Cl.
*H03L 7/00* (2006.01)
(52) U.S. Cl. ............... 331/16; 331/17; 331/44; 331/182; 331/183; 331/186
(58) Field of Classification Search .................... 331/14, 331/16, 17, 44, 182, 183, 186, 11; 327/94, 327/156

See application file for complete search history.

(56) References Cited

U.S. PATENT DOCUMENTS

| | | | |
|---|---|---|---|
| 4,849,993 A | 7/1989 | Johnson et al. | |
| 4,943,788 A | 7/1990 | Laws et al. | |
| 5,410,572 A * | 4/1995 | Yoshida | 375/376 |
| 5,656,975 A * | 8/1997 | Imura | 331/11 |
| 5,986,514 A * | 11/1999 | Salvi et al. | 331/17 |
| 6,342,818 B1 * | 1/2002 | Segawa et al. | 331/14 |
| 6,566,967 B1 * | 5/2003 | Anumula et al. | 331/11 |
| 6,624,675 B2 | 9/2003 | Neron | |
| 6,643,347 B2 * | 11/2003 | Ohishi | 375/376 |
| 7,230,505 B2 * | 6/2007 | Rachedine et al. | 331/179 |
| 7,277,036 B2 * | 10/2007 | Otake | 341/154 |
| 7,332,940 B2 * | 2/2008 | Watanabe | 327/94 |
| 7,375,592 B2 | 5/2008 | Skerritt | |
| 2002/0190764 A1 | 12/2002 | Nichols | |
| 2008/0143590 A1 | 6/2008 | McBurney | |
| 2008/0238508 A1 | 10/2008 | Jing | |

OTHER PUBLICATIONS

Altera Corporation, "Implementing Clock Switchover in Stratix and Stratix GX Devices," Application Note AN-313-1.0, Jan. 2004, pp. 1-16, available from Altera Corporation, 101 Innovation Drive, San Jose, CA 95134.
Analog Devices, Inc., "12-Output Clock Generator with Integrated 1.6 GHz VCO," AD9517-4, Rev 0, Jul. 2007, pp. 1-3 and 38-39, available from Analog Devices, Inc., One Technology Way, Norwood, MA 02062.
U.S. Appl. No. 12/338,368, filed Dec. 18, 2008, Wong et al.

* cited by examiner

*Primary Examiner* — Joseph Chang
*Assistant Examiner* — Jeffrey Shin
(74) *Attorney, Agent, or Firm* — Scott Hewett; LeRoy D. Maunu

(57) ABSTRACT

A semiconductor device having a phase-locked loop ("PLL") (100) drives a VCO (114) of the PLL circuit with a first control voltage ($V_{CTRL}$) produced by a loop filter (112) when a first clock signal (clk_ref) is present. The VCO produces an output frequency while the PLL circuit is operating off the first clock signal. When the first clock signal is lost (ref_lost), a control voltage maintenance circuit (120) produces a second control voltage maintaining the VCO output frequency. In one device, the control voltage maintenance circuit includes a phase-frequency detector (104) that can operate off of either the clock reference signal or a master clock signal. In an alternative device, the control voltage maintenance circuit includes a voltage generator (334, 362) that produces a generated voltage that drives the loop filter when lock is lost.

20 Claims, 7 Drawing Sheets

STABLE VCO OPERATION IN ABSENCE OF CLOCK SIGNAL

FIELD OF THE INVENTION

One or more aspects of the present invention relate generally to semiconductor devices and, more particularly, to operating a voltage-controlled oscillator ("VCO") in a phase-locked loop ("PLL") of an integrated circuit ("IC") when a clock signal is lost.

BACKGROUND OF THE INVENTION

A VCO is an important functional block in many types of analog, digital, and mixed-signal circuits. VCOs are used in PLLs in a wide variety of applications, such as clock generation, tuning circuits, and frequency synthesis. There are many types of VCOs and PLLs.

In one type of PLL, a phase-frequency detector ("PFD") compares a reference clock signal to a feedback clock signal generated by a VCO to determine whether a charge pump needs to increase or decrease the charge in a loop filter. The loop filter produces a control voltage ("$V_{CTRL}$") that controls operation of the VCO and the clock signal produced by the VCO, thus completing the loop to maintain lock between the reference clock and feedback clock signals.

The PLL operates off of a clock signal. If the clock signal is lost, the operation of the VCO typically drifts off the lock frequency. Several responses to clock loss are possible. In some applications, the PLL circuitry is disabled by control logic that senses the loss of the clock signal to the VCO. The charge pump driving the loop filter of the PLL system is typically disabled, and the control (output) voltage of the VCO can drift. In another approach, the PLL circuitry remains active and the charge pump typically drives the loop filter to a supply rail depending on whether a reference clock or a feedback clock is lost. In another technique, a clamp circuit is activated when the clock is lost, and the clamp circuit holds the PLL at an operating point between the supply rails.

In each of the above cases, the voltage of the loop filter can be significantly different from that when the PLL is locked. This increases the time it takes to re-lock the PLL when the clock signal becomes available again. Additionally, it is possible for the VCO control voltage to be higher than the required lock voltage, which can cause problems in the PLL application.

Therefore, techniques for operating VCO-based circuits when the VCO clock signal is lost that avoid the problems of the prior art are desirable.

SUMMARY OF THE INVENTION

Presented here is a semiconductor device and method for its use that maintains A semiconductor device having a PLL drives a VCO of the PLL circuit with a first control voltage produced by a loop filter when a first clock signal is present. The VCO produces an output frequency while the PLL circuit is operating off the first clock signal. When the first clock signal is lost, a control voltage maintenance circuit produces a second control voltage maintaining the VCO output frequency. In one embodiment, the control voltage maintenance circuit includes a phase-frequency detector that can operate off of either the clock reference signal or a master clock signal. In an alternative embodiment, the control voltage maintenance circuit includes a voltage generator that produces a generated voltage that drives the loop filter when lock is lost.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1A:
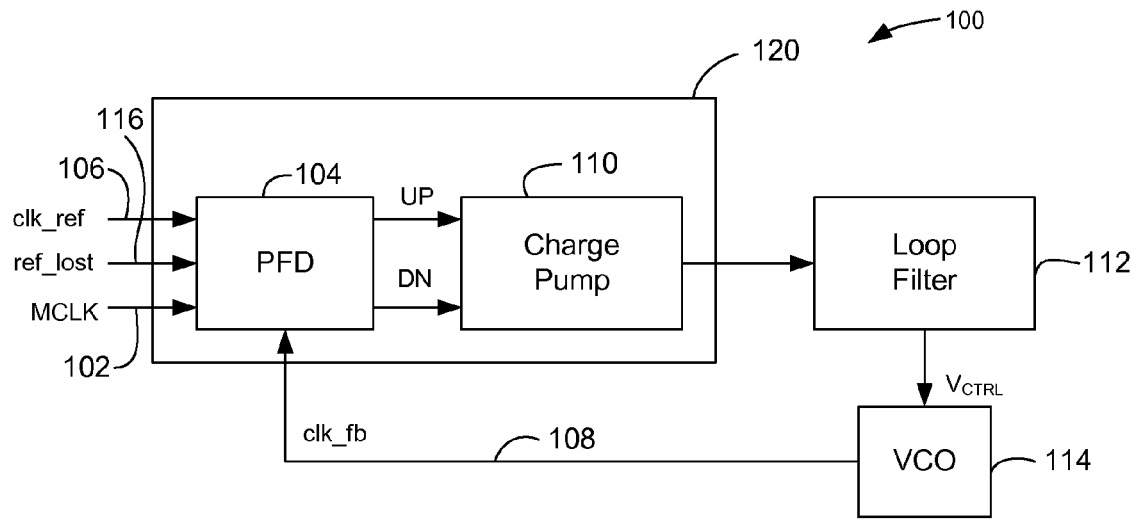
FIG. 1A is a diagram of a PLL circuit using a master clock signal supplied to a PFD in accordance with one embodiment.

FIG. 1A is a diagram of a PLL circuit 100 using a master clock signal 102 supplied to a PFD 104 in accordance with an embodiment. In normal operation, the PFD 104 compares a clock reference signal 106 with a clock feedback signal 108 to determine whether the PLL needs adjustment. The PFD 104 provides an UP or DOWN signal to a charge pump 110 that adds or removes charge to a loop filter 112 until phase lock is achieved. Loop filters are often conceptualized as a resistor in parallel with a capacitor (not separately shown). Charge from the charge pump is added to or removed from the loop filter in pulses to adjust the output voltage $V_{CTRL}$ until loop lock is achieved. $V_{CTRL}$ controls the output frequency of a VCO 114. The VCO 114 produces the clock feedback signal 108 that is compared to the clock reference signal 106. Several variations of PLLs are known in the art, and the PLL of FIG. 1A is merely exemplary.

When the PLL is operating normally (i.e., in a phase locked condition), the VCO output is locked to the clock reference signal and $V_{CTRL}$ is stable. However, if the clock reference signal is lost, loop lock is also lost. Typically, the VCO output frequency drifts. The further the VCO output frequency drifts from the clock reference signal frequency, the longer it typically takes for loop lock to be regained after the clock reference signal becomes available again.

Several events could lead to the clock reference signal being unavailable to the PFD. For example, the clock reference signal might be supplied from an external source that is temporarily switched off or disconnected, or provided on-chip by a block that is temporarily shut off or the clock signal is temporarily switched off or drops out due to a turn-on transient of another block of the IC. Temporary loss of the clock reference signal is of particular concern in FPGAs, where a user can configure the IC to any of several applications, and might inadvertently introduce a temporary reference clock loss, such as be inadvertently shutting down a MUX that routes the reference clock signal to the PFD.

When the clock reference signal 106 is lost, a reference lost signal 116 is provided to the PFD 104 and the PFD 104 uses an alternative clock signal, such as the master clock signal 102, to generate UP and DOWN signals that drive the charge pump 110, which in turn adds and removes charge from the loop filter, maintaining $V_{CTRL}$ more closely to the value it was when lock was lost. In a particular embodiment, the PFD generates alternating UP and DOWN control signals when operating off of a master clock signal. Another clock signal, such as a local clock signal or even a feedback clock signal, can be alternatively used. Alternatively, the PFD includes a detector that detects when the clock reference signal is lost and automatically shifts operation to the master clock signal. This requires additional logic circuitry to determine clock loss and operational shift to the master clock signal which can be a part of the PFD. In a particular embodiment, the PFD includes a high-frequency circuit portion for operating off the reference clock signal and a low-frequency circuit portion for operating off the master clock signal, and loss of the reference clock signal switches operation from the high-frequency circuit portion to the low-frequency circuit portion. In an alternative embodiment, the PFD is designed to have an input frequency response sufficient operate off of either the reference clock signal or off of the master clock signal.

Master clock signals are familiar to those of skill in the art and are available to the PFD even when the clock reference signal is not because the master clock signal is a global clock signal, typically independently generated by an oscillator, and is not localized to the PLL or necessarily linked to the reference clock signal. In an alternative embodiment, a first PFD is used for operation when the clock reference signal is present, and a second PFD is used for operation when the clock reference signal is lost and the loop operates off of the master clock signal. Additional logic is required to shift between the two PFD when clock is lost or becomes available.

Conventional PFDs are designed to operate off a clock reference signal that is typically a much higher clock rate than the master clock signal. The PFD 104 is designed to operate off of the clock reference signal 106 during normal operation and off the master clock signal 102 when the clock reference signal 106 is lost. This allows the charge pump 110 to keep providing current pulses to the loop filter 112 to produce a control voltage that remains close to the control voltage present when the clock reference signal and loop lock were lost. Unlike conventional PFDs, which produce only DOWN pulses or only UP pulses to drive the VCO frequency low when lock is lost, the PFD 104 generates both UP and DOWN control signals when the clock reference signal is lost. The PFD 104 and charge pump 110 operate as a control voltage maintenance circuit 120 operating off the master clock signal that drives the loop filter 112 to maintain a control voltage close to the value produced when the loop was locked.

In an exemplary embodiment, the master clock is operating at between about 50 MHz to about 100 MHz and the clock reference signal and clock feedback signal are much usually but not necessarily higher in frequency than the master clock signal, such as about ten times the master clock signal (typically in the range anywhere from low MHz to GHZ), which produces a reference clock signal in the range of about low MHz to about 1 GHz or more, but not necessarily related to the master clock signal. The lower master clock frequency results in different loop considerations than conventional loops designed to operate only off of the higher frequency clock signal. In a particular embodiment, the PFD 104 is designed to operate off of either a reference clock signal or a lower-frequency master clock signal.

Figure 1B:
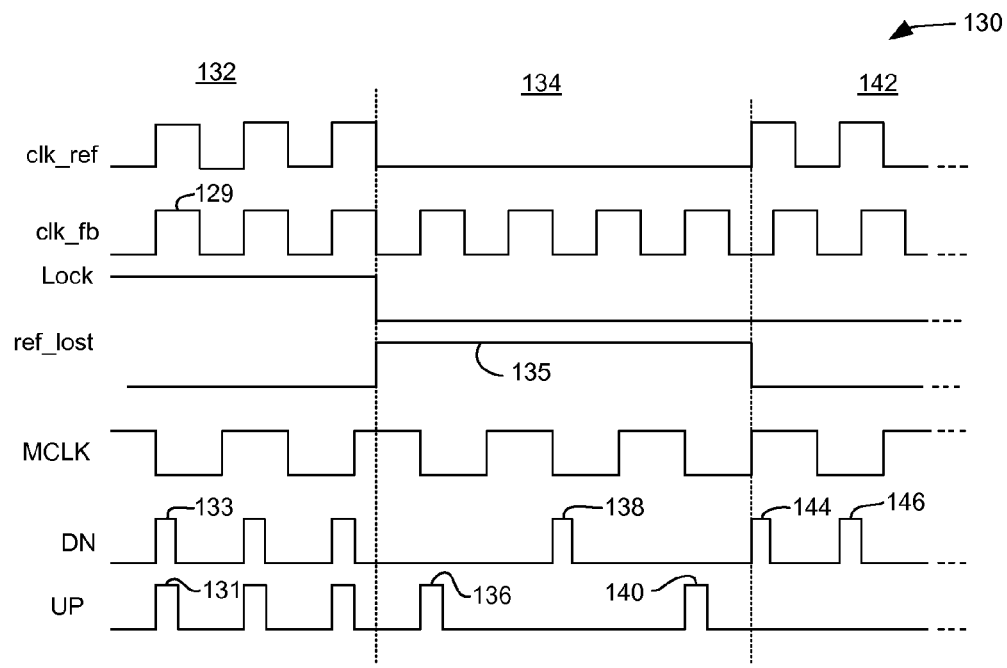
FIG. 1B is a timing diagram for operating a PLL in accordance with the circuit of FIG. 1A.

FIG. 1B is a timing diagram 130 for operating a PLL in accordance with the circuit of FIG. 1A. In a first region 132, the PLL is locked. An UP pulse 131 and a DOWN pulse 133 of minimum width (i.e., least charge transfer to the loop filter per pulse) are generated every clock cycle 129 of the clock reference/clock feedback. The ref_lost signal is LOW and the LOCK signal is also HIGH. The pulses source and sink current into the loop filter to maintain lock, basically refreshing the charge on the loop filter capacitor to maintain the voltage producing the lock $V_{CTRL}$. If lock is lost, current is added or subtracted using UP or DOWN pulses to adjust $V_{CTRL}$ and tune the VCO, as is well known in the art of PLLs. The UP and DOWN pulses are triggered on the leading edge of the clk_ref signal; however, this is merely exemplary and the pulses are triggered differently in alternative embodiments.

In a second region 134, The clock reference signal is lost, sending the ref_lost signal HIGH 135 and the PLL operates off the master clock signal MCLK, producing a first UP pulse 136 on the trailing edge of a first master clock cycle, a first DOWN pulse 138 on a second master clock cycle, and a second UP pulse 140 on a third master clock cycle. The alternating UP and DOWN pulses maintain charge in the loop filter close to the charge present when lock was lost. Ideally, a first amount of charge is added, and then that amount of charge is removed. Alternatively, simultaneous UP and DOWN pulses are generated off each master clock cycle. The pulses are shown being generated on the trailing edge of the master clock cycles, but this is merely exemplary and alternative clocking schemes are used in other embodiments.

The scale of clock cycles has been adjusted in order to conveniently show the clock reference and master clock cycles on the same axis. Those of skill in the art understand that the master clock cycles, and hence the UP and DOWN pulses, would appear much further apart if drawn to the scale of the clock reference.

In a third region 142, the clock reference signal is re-established (i.e., ref_lost goes LOW), but the PLL has not re-gained lock (i.e., the LOCK signal is still LOW). In this case, more DN pulses 144, 146 were applied while the clock reference signal was lost. The lock-up time is shortened, compared to conventional techniques, because using the control voltage maintenance circuit maintained a value near $V_{CTRL}$ when the clock reference signal was lost, rather than letting the VCO drift or pulling the VCO LOW. Lock is regained more quickly and with fewer pulses after the clock reference signal becomes available again. The PLL seeks to re-establish loop lock, at which point the PLL operates as shown in the first region 132.

Design features are incorporated into the PFD 104 allowing the PFD 104 to operate off the master clock signal or other available clock signal when the clock reference signal is lost. In one embodiment, the state machine of a conventional PFD is modified to operate from either clock signal and the master clock signal is coupled to the PFD. In an alternative embodiment, the PFD 104 is configured to operate off of the clock feedback signal when the clock reference signal is lost. The clock feedback signal is often higher in frequency than the master clock signal. Even though the clock feedback signal will drift after lock is lost, it can remain very close to the lock frequency for short periods of time, allowing good maintenance of the control voltage. In another embodiment, a first PFD operates off the reference clock signal, and a second PFD operates off the master clock signal or alternative clock signal. The PLL switches operation from the first PFD to the second PFD when the reference clock signal is lost, and switches back to the first PFD when the clock reference signal is regained.

As explained above in reference to FIG. 1B, second region 134, when an UP pulse is received during a first master clock cycle, charge is provided to the loop filter by the charge pump, which causes the control voltage $V_{CTRL}$ to rise according to:

$$V_{CTRL} = V_{CTRL0} + I_{UP} * \Delta t / C_{LF} \quad \text{(Eq. 1)}$$

Where $V_{CTRL0}$ is the initial (pre-pulse) control voltage, $I_{UP}$ is the charge pump pull-up current, $C_{LF}$ is the loop filter capacitance, and $\Delta t$ is the pulse width of the UP pulse (which, when the master clock is operative, is the minimum pulse width). It is generally desirable to use a pulse width as narrow as possible to keep power consumption low.

When a DOWN pulse is received during the next master clock cycle, charge is removed from the loop filter, which causes $V_{CTRL}$ to drop so that after two master clock cycles, the control voltage is:

$$V_{CTRL} = V_{CTRL0} + (I_{UP} * \Delta t / C_{LF}) - (I_{DOWN} * \Delta t / C_{LF}) \quad \text{(Eq. 2)}$$

If $I_{UP} = I_{DOWN}$, then the control voltage is maintained at the initial control voltage, which keeps the VCO operating at the frequency it was operating at when the clock reference signal was lost. In practice, some charge is lost in the loop filter or the UP and DOWN current pulses are not exactly equal, and the VCO frequency drifts slightly, but frequency drift is usually in the range of hundreds of kilohertz, rather than the several megahertz that can be seen in conventional PLLs when the clock reference signal is lost. In a particular embodiment, a resistor in parallel with a capacitor in the loop filter is switched off (i.e., disconnected so that it no longer draws current off the capacitor in the loop filter) when the clock reference is lost.

Figure 2:
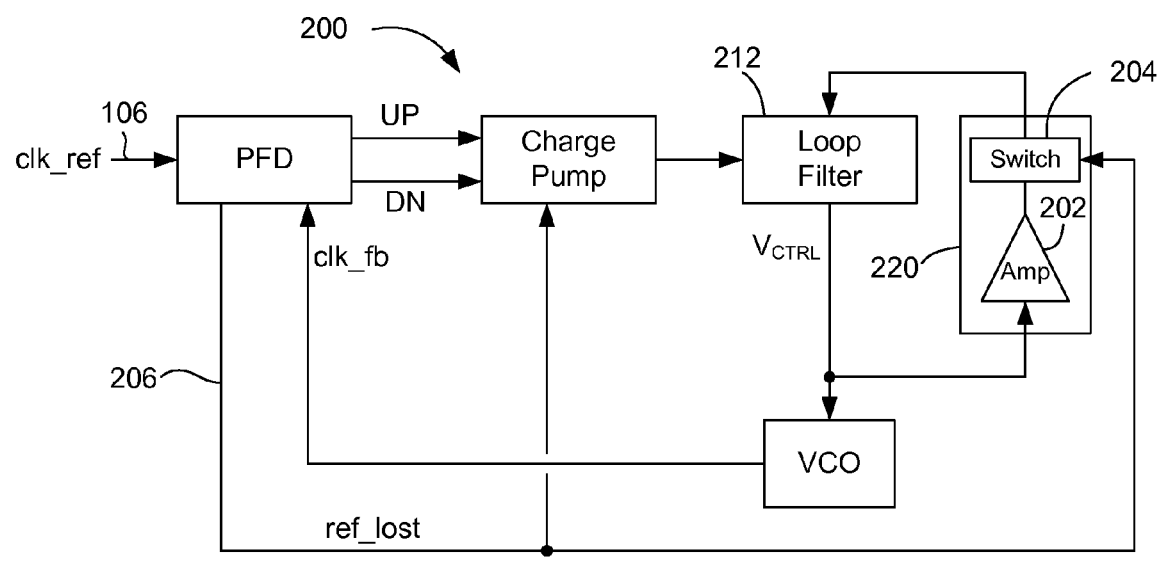
FIG. 2 is a diagram of a PLL circuit using an analog buffer of a VCO control voltage in accordance with an embodiment.

FIG. 2 is a diagram of a PLL circuit 200 using an analog buffer 202 of a VCO control voltage $V_{CTRL}$ in accordance with an embodiment. A switch 204 operates off of a ref_lost signal generated by the PFD when the reference clock signal clk_ref is lost. When the clock reference signal is lost, the analog buffer 202 is coupled to the loop filter 212 and the charge pump is turned OFF or disconnected from the loop (not shown). A control voltage maintenance circuit 220 includes the analog buffer 202 and the switch 204 operating off the clock lost signal 206.

The analog buffer 202 has high open loop gain and high output resistance, typically in the range of tens of megohms, and the desired overall gain around the loop through the analog buffer 202 is unity. In a particular embodiment, the analog buffer is a cascode amplifier configuration. The analog buffer slows the rate of decay of the loop filter output $V_{CTRL}$ by providing a current source to the loop filter. In other words, instead of just the loop filter capacitor discharging through the loop filter resistance, a relatively high current/charge source is provided from the control voltage maintenance circuit to the loop filter. While the analog buffer is not an independent driving mechanism in that $V_{CTRL}$ is both sensed by the analog buffer and also driven by it, the analog buffer slows the rate of decay of $V_{CTRL}$ according to:

$$V_{CTRL} = V_{CTRL0} * \exp[-t/(R_{ON} * C_{LF} * (1-A))] \quad \text{(Eq. 3)}$$

where "t" represents the decay time, $R_{ON}$ is the combined output resistance of the amplifier and switch, and "A" is the overall gain around the loop. In a particular embodiment, the decay rate of $V_{CTRL}$ is slowed by a factor of ten using a near-unity gain cascode amplifier as the analog buffer. This keeps $V_{CTRL}$ much closer to the control voltage present when the clock reference signal 106 was lost ($V_{CTRL0}$), and facilitates quicker re-locking. In a particular embodiment, $V_{CTRL}$ is maintained within a few millivolts ("mV") of $V_{CTRL0}$, typically less than about 5 mV to about 10 mV, during the period in which the reference clock signal is lost, which maintains the frequency of the VCO within about 50-500 kHz in a particular embodiment. In a comparable conventional PLL without the control voltage maintenance circuit, VCO drift of about several 10's of MHz occurred during the same period of time that the clock reference signal was lost.

Figure 3A:
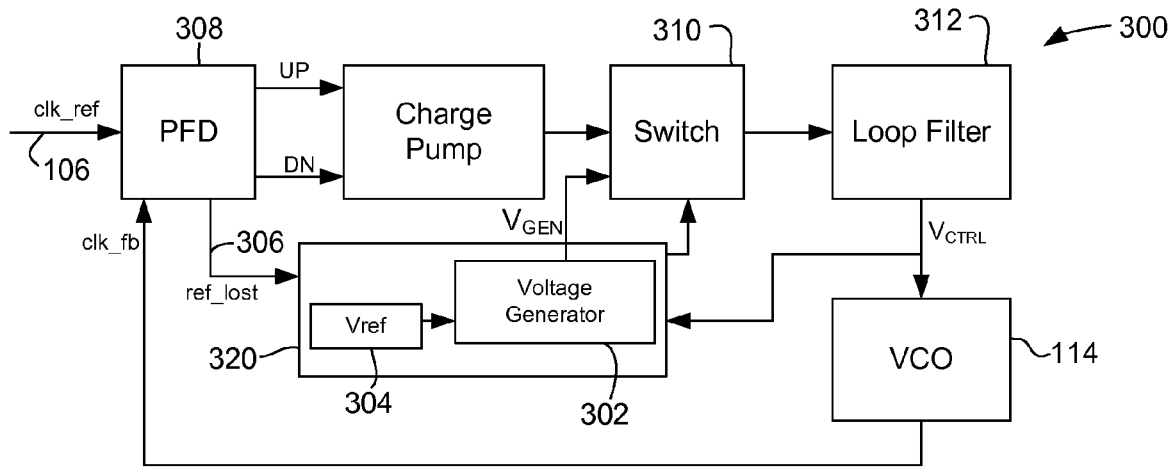
FIG. 3A is a diagram of a PLL circuit using a reference voltage generator in accordance with an embodiment.

FIG. 3A is a diagram of a PLL circuit 300 using a voltage generator 302 in accordance with an embodiment. The remainder of the PLL circuit will be familiar to those of skill in the art, particularly in light of FIGS. 1A and 2A and associated description, and a more detailed description of these components is omitted.

An independent reference voltage $V_{REF}$ is provided to the voltage generator 302. The reference voltage is provided by a resistive voltage divider, ground, reference frequency detector, or a junction voltage reference, for example, or other voltage reference source, and in a particular embodiment, $V_{DD}$ is used for the reference voltage. The control voltage $V_{CTRL}$ is provided to a control voltage maintenance circuit 320 that basically matches a generated voltage $V_{GEN}$ to the control voltage when the loop is locked. When the clock reference signal is lost, $V_{GEN}$ is provided to the loop filter.

The PFD 308 produces a signal ref_lost 306 when the reference clock signal 106 is lost. The ref_lost signal is alternatively generated by another circuit and supplied to the PLL. In a particular embodiment, the voltage generator 302 always operates off the master clock signal (not shown for simplicity of illustration) or other clock signal. Alternatively the voltage generator 302 operates off the reference clock signal unless that signal is lost, and then operates off a second clock signal, such as the master clock signal.

When the clock reference signal 106 is available and the PLL circuit 300 has achieved lock, a control voltage $V_{CTRL}$ is produced that is coupled to the VCO 114. This control voltage $V_{CTRL}$ is also coupled to the control voltage maintenance circuit 320, which generates $V_{GEN}$ to match $V_{CTRL}$ during normal operation of the PLL circuit. When the clock reference signal is lost, the switch 310 disconnects the charge pump from the loop filter and connects $V_{GEN}$ to drive the loop filter 312, and VCO 114.

$V_{GEN}$ is basically a close approximation of the control voltage provided from the loop filter 312 to the VCO 114 at the time the reference clock signal was lost. The VCO 114 maintains an output frequency clk_fb near the output frequency generated during phase locked operation. When the reference clock signal is re-established, the switch 310 switches $V_{GEN}$ out and re-connects the charge pump to the loop filter 312. PLL circuit 300 regains lock quickly because the VCO is operating near the proper frequency for lock.

Figure 3B:
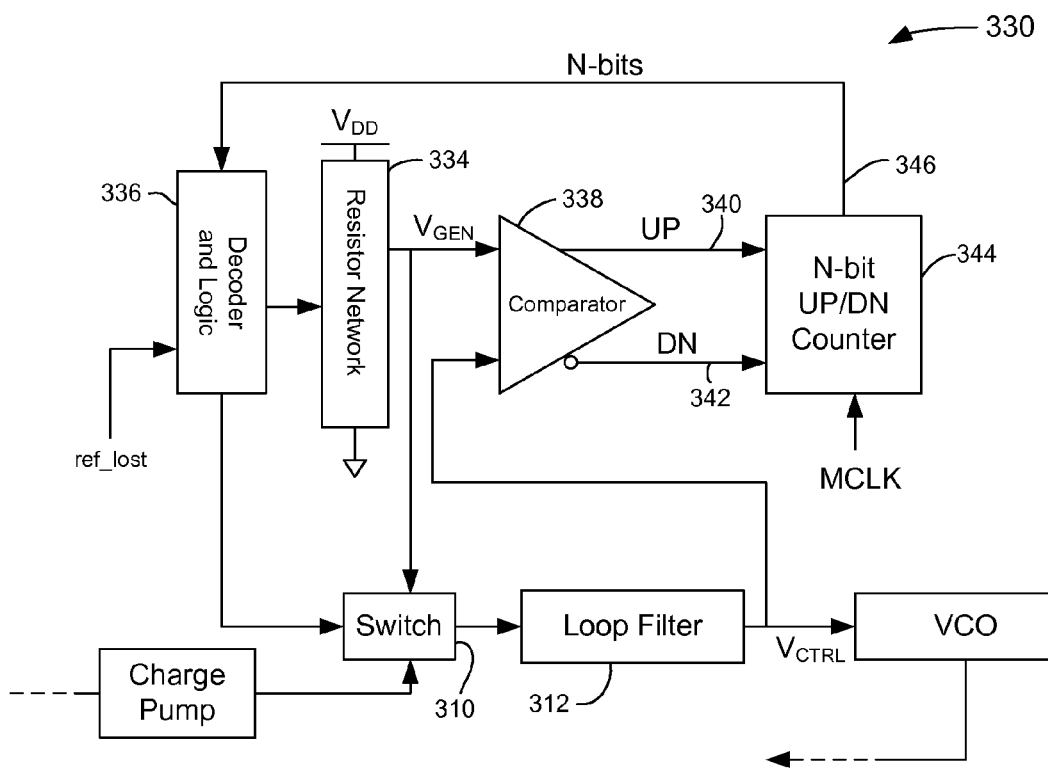
FIG. 3B is a diagram of a portion of a PLL circuit using a resistor network voltage generation technique according to an embodiment.

FIG. 3B is a diagram of a portion of a of PLL circuit 330 using a resistor network voltage generation technique according to an embodiment. A voltage generator 334 operates off a reference voltage of $V_{DD}$, but alternatively operates off of another relatively stable available voltage. The voltage generator 334 is a multi-tap resistor network providing 2N levels of voltage for N resistors. In an alternative embodiment, the voltage generator uses one or more transistors (see, e.g., FIG. 30, ref. num. 362). A comparator 338 compares $V_{GEN}$ to $V_{CTRL}$ and generates UP 340 or DOWN 342 adjustment pulses according to whether $V_{GEN}$ is less than or greater than $V_{CTRL}$. A counter 344 running off the master clock signal MCLK counts the adjustment pulses from the comparator 338 and generates adjustment bits 346, which are provided to a Decoder and Logic block ("decoder") 336. The decoder produces an adjustment signal 337 that selects the correct tap of the resistor network 334 to connect to $V_{GEN}$ to produce an adjusted generated voltage that is closer to $V_{CTRL}$.

When the reference clock is lost, the Decoder and Logic block 336 operates the switch 310 to disconnect the charge pump from the loop filter 312 and to drive the loop filter 312 with $V_{GEN}$. The charge pump is optionally switched OFF when the clock reference signal is lost. When the reference clock is lost, the Decoder and Logic block also fixes $V_{GEN}$ at its current value (i.e., the comparison function is halted). In a particular embodiment, an analog buffer (see FIG. 2) is included to drive the loop filter and VCO to $V_{GEN}$.

Figure 3C:
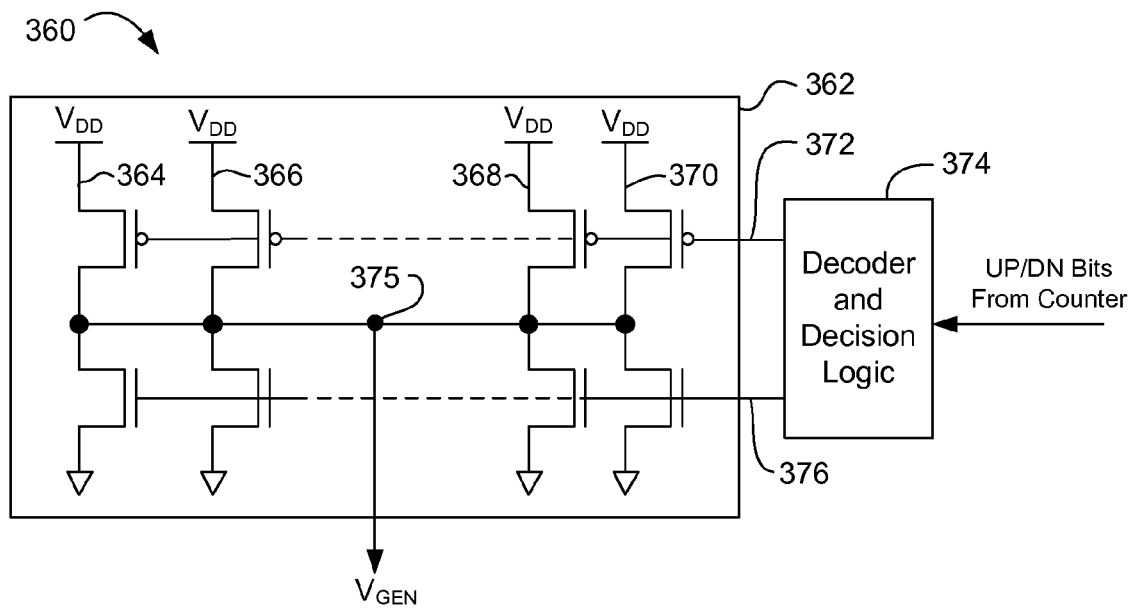
FIG. 3C is a circuit diagram of a portion of a PLL circuit using a CMOS voltage generation technique according to an embodiment.

FIG. 3C is a circuit diagram of a portion of a PLL circuit 360 using a CMOS reference voltage generation technique according to an embodiment. A voltage generator 362 has a number of CMOS legs 364, 366, 368, 370, only four of which are shown for clarity of illustration. The number of CMOS legs can be greater than or less than four, depending on several factors, such as the size of the resistors and desired output impedance. Each of the CMOS legs has a PMOS device in series with an NMOS device and develops a voltage $V_{GEN}$ at intermediate node 375 between $V_{DD}$ and ground, depending on how the PMOS and NMOS devices are biased. Each of the PMOS devices are controlled by a first signal bus ("PMOS control signal", which is a single signal or alternatively several signals on a signal line or bus) 372 from a decoder and decision logic circuit 374 ("decoder") that biases the gates of the device, which controls the resistance through the PMOS device to $V_{DD}$. As the PMOS device is turned ON, the channel resistance drops and the voltage at the intermediate node 375 rises toward $V_{DD}$. Each of the NMOS devices are controlled by a second signal bus ("NMOS control signal") 376 from the decoder and decision logic circuit 374. As the NMOS devices are turned ON, the voltage at the intermediate node 375 is coupled more strongly to ground. Thus, by turning the PMOS devices ON and OFF relative to the NMOS devices, a wide range of selected voltage is possible at the intermediate node 375, which provides the desired $V_{GEN}$, adjusted according to the feedback bits from the counter 334.

The decoder and decision logic circuit 374 determines the proper first or second signal for turning the PMOS or NMOS devices ON to generate the desired $V_{GEN}$ to approximated $V_{CTRL}$ during normal operation of the PLL circuit using adjustment bits from a counter as described above in reference to FIG. 3B or alternative technique. In a particular embodiment, $V_{GEN}$ is a function of the word line ratios of the transistors that are turned ON. The voltage generator 362 maintains the operating frequency of the VCO (not shown, see, e.g., FIG. 3A, ref. num. 114) by turning on the requisite number of PMOS and NMOS devices at a level that produces a $V_{GEN}$ at node 375 that approximates the control voltage output from the loop filter (see, FIG. 3A, ref. num. 312) when the clock reference signal was lost. The multiple CMOS legs are relatively compact and provide relatively high current compliance and low power consumption compared to resistor network-based voltage dividers. Other types of voltage generators are alternatively used, such as a controlled transistor in series with a load resistor.

In a particular embodiment, the decoder and decision logic circuit turns the NMOS devices ON and OFF before the PMOS devices are turned ON. In an alternative embodiment, the PMOS devices are turned ON and OFF before the NMOS devices are turned ON. And in yet another embodiment, NMOS and PMOS devices are alternatively turned ON and OFF.

Figure 4A:
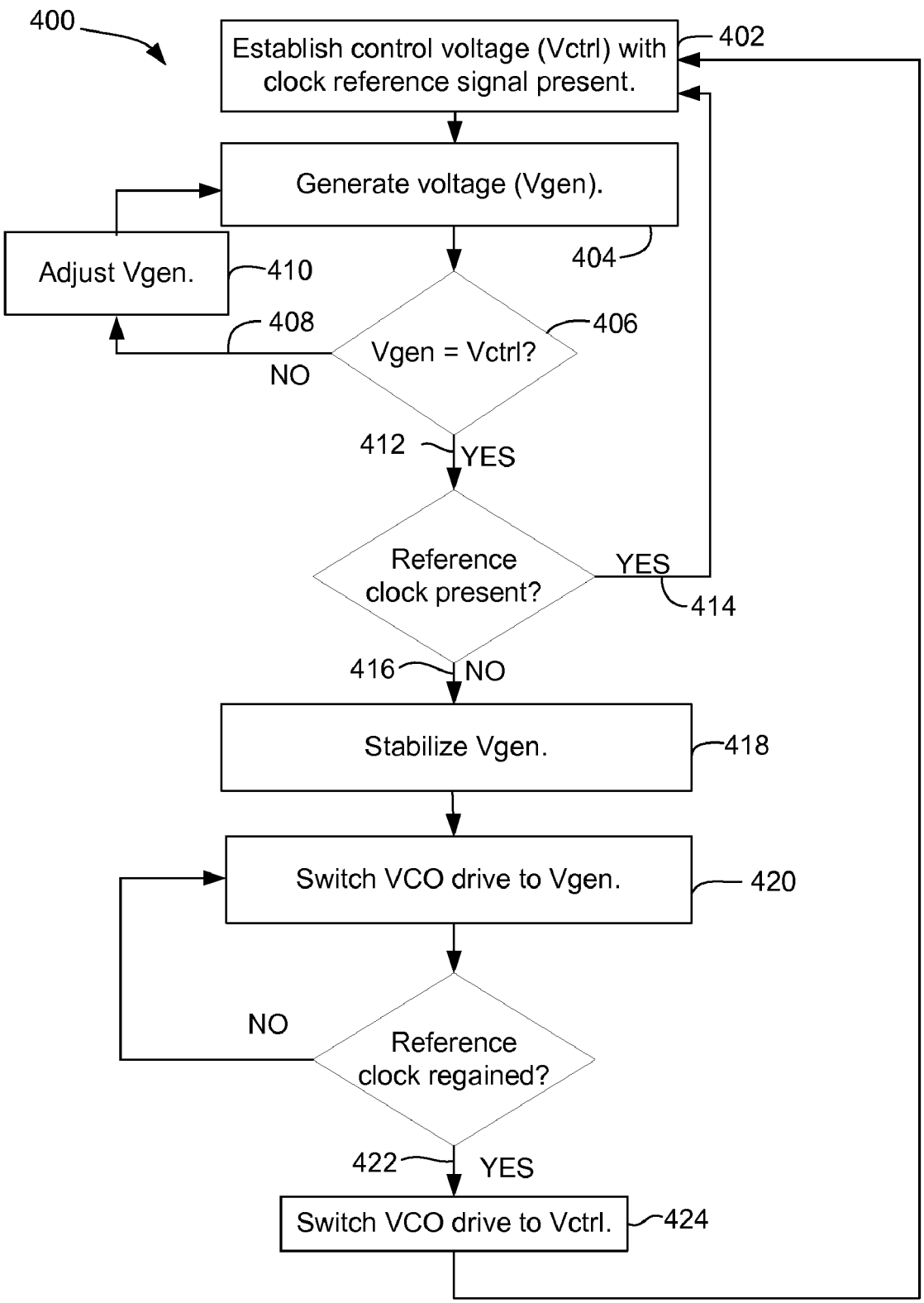
FIG. 4A is a flow chart of a method of operating a PLL according to an embodiment.

FIG. 4A is a flow chart of a method of operating a PLL circuit 400 according to an embodiment. A control voltage $V_{CTRL}$ driving a VCO of the PLL is established while a reference clock signal is present (step 402). Typically, the PLL is locked during this portion of the method; however, lock is not required. An independent voltage $V_{GEN}$ is generated by a voltage generator (step 404). The generated voltage $V_{GEN}$ is compared to the control voltage $V_{CTRL}$ (step 406) and if the generated voltage is not approximately equal to the control voltage (branch 408), typically within about 10 mV or less, the $V_{GEN}$ is adjusted (step 410) until $V_{GEN}$ replicates $V_{CTRL}$ (branch 412). In a particular embodiment, $V_{GEN}$ is compared to $V_{CTRL}$ and an adjustment bit is generated according to the comparator output and provided to a decoder to increase or decrease $V_{GEN}$ until $V_{GEN}$ replicates $V_{CTRL}$. Those of skill in the art appreciate that, while $V_{GEN}$ might equal $V_{CTRL}$ in some instances, establishing a $V_{GEN}$ within approximately about 5 mV to about 10 mV provides an unlocked voltage essentially equal to $V_{CTRL}$ sufficient for providing acceptable VCO stability. A higher degree of control (i.e., keeping $V_{GEN}$ within less than about 5 mV) requires more silicon area, power, and design complexity. An equals sign is used in step 406 for convenience of discussion and illustration. How closely $V_{GEN}$ replicates $V_{CTRL}$ depends on several design factors, such as how sensitive the VCO output frequency is to tuning voltage and how finely the voltage generator may be adjusted. In an exemplary embodiment, $V_{GEN}$ keeps the VCO output frequency within 100 kHz of the clock feedback signal produced with $V_{CTRL}$; however, some embodiments generate a $V_{GEN}$ that maintains the VCO output frequency even closer to the clock feedback signal when the PLL is locked.

This process continues (branch 414) while the reference clock signal is present. Thus, if $V_{CTRL}$ drifts due to temperature variations, for example, $V_{GEN}$ will track such changes. When the reference clock signal is lost (branch 416), $V_{GEN}$ is stabilized (step 418), i.e., $V_{GEN}$ is no longer adjusted, and the VCO drive is switched from $V_{CTRL}$ to $V_{GEN}$ (step 420). When the reference clock is regained (branch 422), the VCO drive is switched from $V_{GEN}$ to $V_{CTRL}$. When the VCO drive is switched back to $V_{CTRL}$, this control voltage ("second control voltage") is typically slightly different from the $V_{CTRL}$ when the clock reference signal was lost because the PLL circuit usually doesn't come back in a locked condition; however, loop lock is typically rapidly obtained. Even when loop lock is re-established, the second control voltage may be different than the initial control voltage due to temperature or operating voltage drift, for example. In a particular embodiment, $V_{GEN}$ is switched to connect to (drive) the loop filter and VCO.

The PLL circuit operates off $V_{CTRL}$, typically rapidly attaining loop lock compared to a conventional PLL without a control voltage maintenance technique according to an embodiment. The comparison of $V_{CTRL}$ to $V_{GEN}$ and adjustment of $V_{GEN}$ is re-established when the reference clock signal is regained, or alternatively, when loop lock is achieved.

Figure 4B:
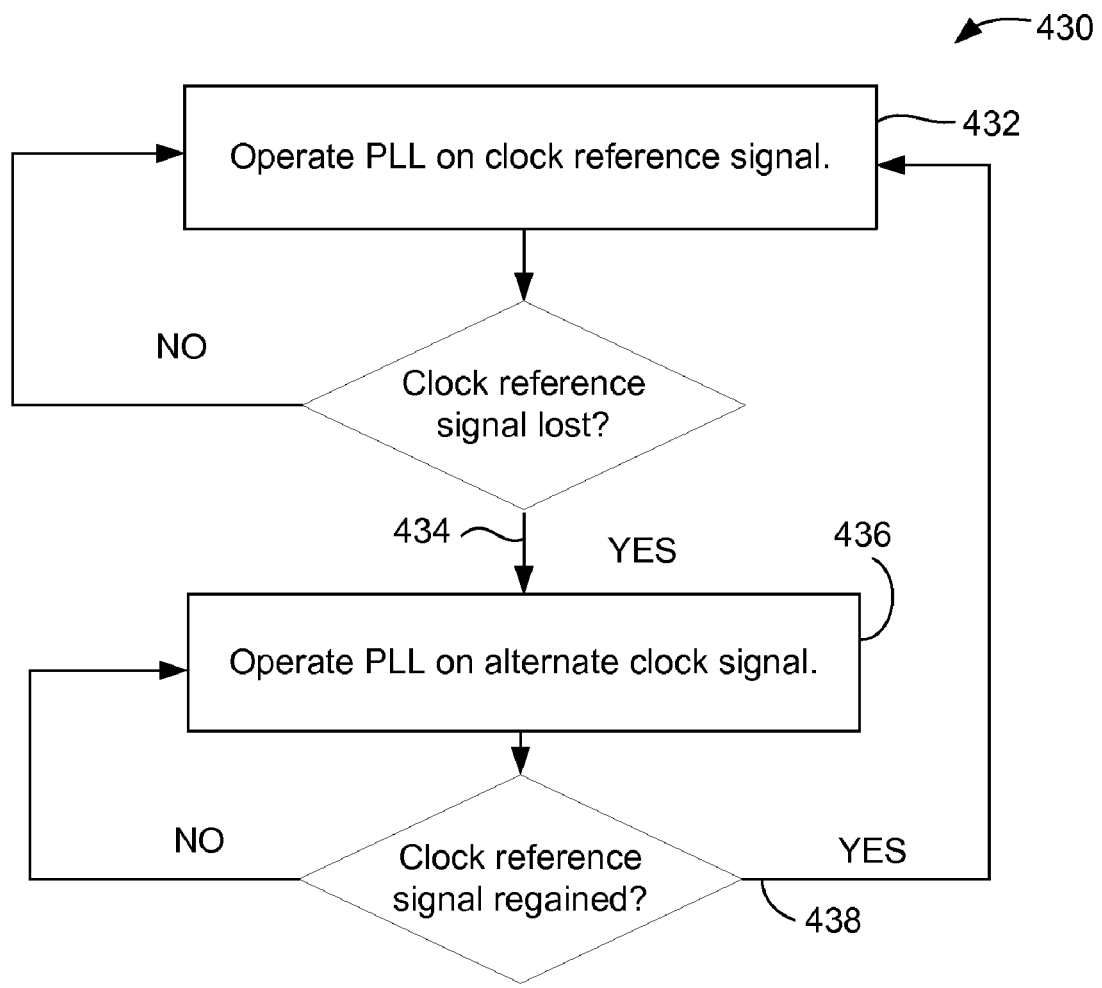
FIG. 4B is a flow chart of a method of operating a PLL circuit according to another embodiment.

FIG. 4B is a flow chart of a method of operating a PLL circuit 430 according to another embodiment. The PLL is operated on a clock reference signal (step 432), typically in a loop locked condition. When the clock reference signal is lost (branch 434), the PLL is operated on an alternate clock signal (step 436) until the clock reference signal is regained (branch 438).

Figure 5:
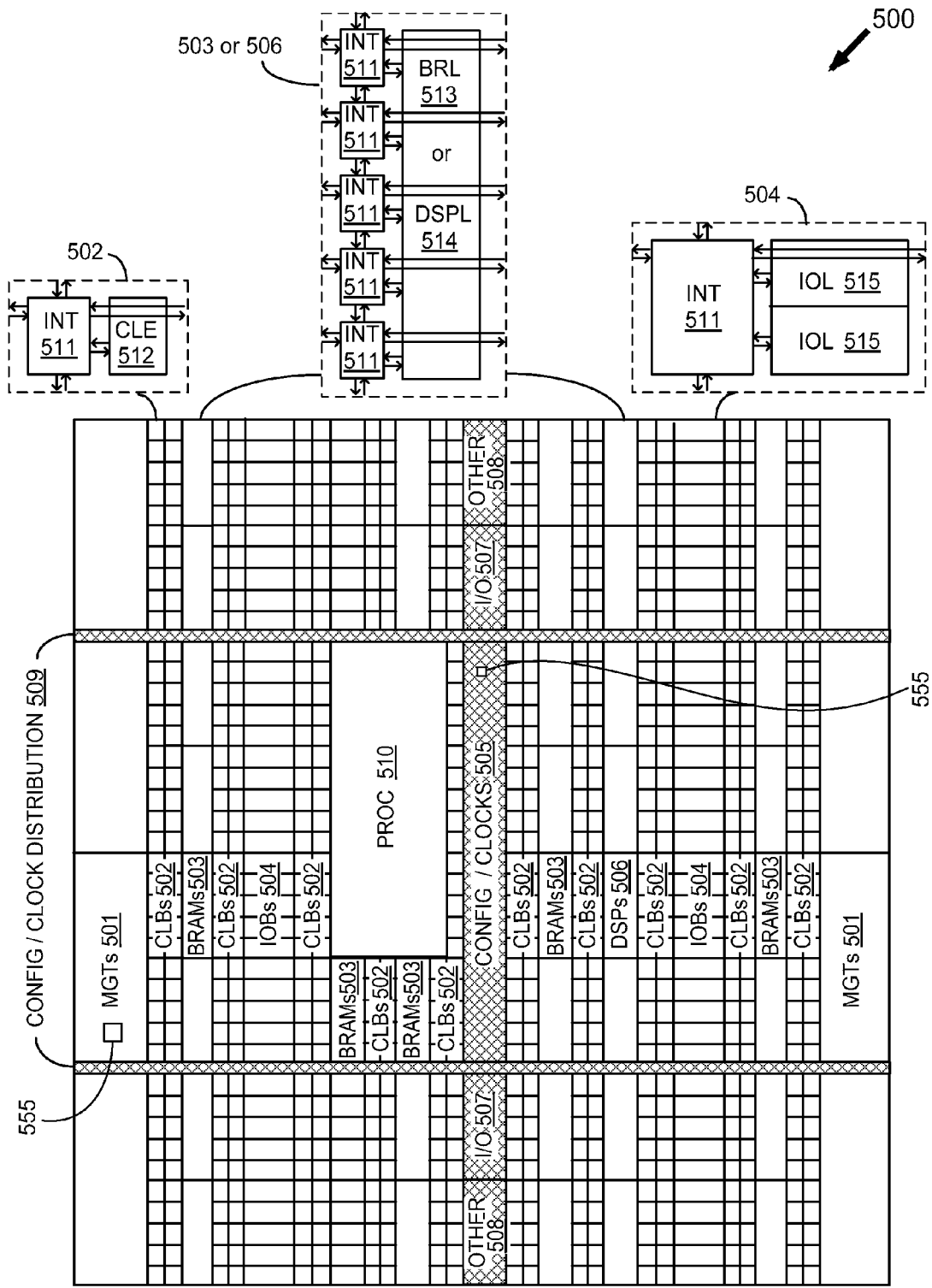
FIG. 5 is a plan view of an FPGA incorporating a VCO stabilization technique in accordance with an embodiment.

FIG. 5 is a plan view of an FPGA 500 incorporating a VCO control voltage maintenance technique in accordance with an embodiment. The FPGA architecture 500 includes a large number of different programmable tiles including multi-gigabit transceivers (MGTs 501), input/output blocks (IOBs 504), configuration and clocking logic (CON 505), configurable logic blocks (CLBs 502), random access memory blocks (BRAMs 503), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510). PLLs 555 incorporating control voltage maintenance circuits according to one or more embodiments are included in any of several configuration or clock blocks 505, transceiver (MGT) blocks 501, or other circuits In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A semiconductor device having a phase-locked loop ("PLL"), comprising:
   a voltage-controlled oscillator ("VCO") configured to generate an output clock signal having an output frequency controlled by a control voltage;
   a charge pump configured to output current pulses in response to a plurality of UP control pulses and a plurality of DOWN control pulses;
   a loop filter configured to generate the control voltage in response to the current pulses from the charge pump;
   a phase-frequency detector ("PFD") wherein:
   in response to a reference frequency of a first reference clock signal being present at the PFD and the output frequency of the output clock signal being locked to the reference frequency, the PFD generates the UP and DOWN control pulses to maintain the control voltage in a locked condition of the PLL, wherein one or more of the UP control pulses are simultaneous with one or more of the DOWN control pulses, respectively, and
   in response to the reference frequency of the first reference clock signal not being present at the PFD, the PFD generates the UP control pulses alternating with the DOWN control pulses based on a second reference clock signal.

2. The semiconductor device of claim 1 wherein the second reference clock signal is a master clock signal of the semiconductor device having a master clock signal frequency.

3. The semiconductor device of claim 2 wherein the reference frequency is at least ten times greater than the master clock signal frequency.

4. The semiconductor device of claim 2 wherein the first reference clock signal is a clock reference signal in a field-programmable gate array and the second reference clock signal is a master clock signal in the field-programmable gate array.

5. The semiconductor device of claim 1 wherein the PFD includes a high frequency circuit portion configured to operate off the first reference clock signal and a low frequency portion configured to operate off the second reference clock signal.

6. The semiconductor device of claim 1 wherein:
   in response to the reference frequency of the first reference clock signal being present at the PFD and the output frequency not being locked to the reference frequency, the PFD is configured to lock the output frequency to the reference frequency, including generating the UP control pulses for increasing the control voltage and generating the DOWN control pulses for decreasing the control voltage; and
   in response to the reference frequency of the first reference clock signal not being present at the PFD, the PFD is configured to maintain the control voltage, including generating the UP control pulses only at each odd clock cycle of a plurality of clock cycles of the second reference clock cycle and generating the DOWN control pulses only at each even clock cycle of the plurality of clock cycles.

7. The semiconductor device of claim 6 further comprising a charge pump configured to add charge to a capacitor for each UP control pulse and to remove charge from the capacitor for each DOWN control pulse, wherein:
   the loop filter includes the capacitor in parallel with a resistance;

the capacitor provides the control voltage; and the resistance is switched off in response to the reference frequency of the first reference clock signal not being present at the PFD.

8. A semiconductor device having a phase-locked loop ("PLL"), comprising:
  a voltage-controlled oscillator ("VCO") generating an output clock signal having an output frequency controlled by a control voltage;
  a charge pump configured to output current pulses in response to a plurality of UP control pulses and a plurality of DOWN control pulses;
  a loop filter producing the control voltage controlling the VCO in response to the current pulses from the charge pump;
  a phase-frequency detector ("PFD") for locking the output frequency of the output clock signal to a reference clock frequency of a first reference clock signal in response to the first reference clock signal being present at the PFD;
  a voltage generator producing a generated voltage at an intermediate node, the voltage generator including at least one CMOS leg disposed between a first reference voltage and a second reference voltage, each CMOS leg including a PMOS device in series with an NMOS device and having an intermediate node between the PMOS device and the NMOS device;
  a comparator comparing the generated voltage to the control voltage to produce adjustment pulses when the generated voltage does not equal the control voltage;
  a counter counting the adjustment pulses to produce adjustment bits; and
  a decoder circuit producing a PMOS adjustment signal and an NMOS adjustment signal coupled to the voltage generator according to the adjustment bits to adjust the generated voltage closer to the control voltage,
  wherein the PMOS adjustment signal adjusts a first channel resistance of the PMOS device in each CMOS leg and the NMOS adjustment signal adjusts a second channel resistance of the NMOS device in each CMOS leg, and the generated voltage produced at the intermediate node is a function of the first and second channel resistances through the PMOS and NMOS devices of the at least one CMOS leg.

9. The semiconductor device of claim 8 further comprising a switch disposed between the voltage generator and loop filter, the switch connecting the generated voltage to drive the loop filter in response to the first reference clock signal not being present at the PFD.

10. The semiconductor device of claim 8 wherein the semiconductor device is a field-programmable gate array ("FPGA") and the counter operates off of a master clock signal of the FPGA.

11. The semiconductor device of claim 8 wherein the voltage generator includes the at least one CMOS leg that is a plurality of CMOS legs, each CMOS leg including the PMOS device in series with the NMOS device, each PMOS device being controlled by the PMOS adjustment signal and each NMOS device being controlled by the NMOS adjustment signal, the intermediate node being between the PMOS device and the NMOS device of each CMOS leg.

12. The semiconductor device of claim 11 wherein at least one of the NMOS adjustment signal and the PMOS adjustment signal includes a plurality of control signals provided on a signal bus.

13. The semiconductor device of claim 8 wherein:
  in response to the reference frequency of the first reference clock signal being present at the PFD and the output frequency of the output clock signal being locked to the reference frequency, the PFD generates each UP control pulse simultaneously with each DOWN control pulse;
  in response to the reference frequency of the first reference clock signal being present at the PFD and the output frequency not being locked to the reference frequency, the PFD locks the output frequency to the reference frequency, including generating the UP control pulses for increasing the control voltage and generating the DOWN control pulses for decreasing the control voltage; and
  in response to the reference frequency of the first reference clock signal not being present at the PFD, the PFD generates the UP control pulses alternating with the DOWN control pulses, the alternating UP and DOWN control pulses being generated from a second reference clock signal.

14. A method of operating a phase-locked loop ("PLL") circuit in an integrated circuit ("IC") comprising:
  establishing an initial control voltage from a loop filter to a VCO of the PLL circuit with a clock reference signal present at the PLL circuit;
  generating a generated voltage on the IC from a reference voltage;
  comparing the generated voltage to the initial control voltage;
  producing adjustment pulses;
  adjusting the generated voltage to replicate the initial control voltage by counting the adjustment pulses to produce adjustment bits;
  decoding the adjustment bits to produce a first adjustment signal biasing a PMOS device of a CMOS leg in a voltage generator circuit to produce a PMOS channel resistance and a second adjustment signal biasing an NMOS device of the CMOS leg to produce an NMOS channel resistance to produce an adjusted generated voltage at an intermediate node of the CMOS leg according to a ratio of the PMOS channel resistance and the NMOS device channel resistance;
  detecting whether the clock reference signal is present, and, if the clock reference signal is not present; and
  driving the loop filter with the adjusted generated voltage.

15. The method of claim 14 further comprising, after the clock reference signal being lost, stabilizing the generated voltage.

16. The method of claim 14 further comprising, after driving the loop filter with the generated voltage,
  detecting whether the clock reference signal is regained, and if the clock reference signal is regained,
  establishing a second control voltage of the PLL circuit, and
  driving the VCO with the second control voltage.

17. The method of claim 16 wherein the second control voltage does not equal the initial control voltage.

18. The method of claim 14 wherein the step of driving the loop filter with the generated voltage includes switching from a charge pump driving the loop filter of the PLL circuit to a voltage generator driving the loop filter of the PLL circuit.

19. The method of claim 14 wherein the NMOS device is turned ON, and then the PMOS device is turned ON.

20. The method of claim 14 wherein the adjusted generated voltage keeps a VCO output frequency within 100 kHz of the clock reference signal.

* * * * *